United States Patent
Kajihara et al.

(10) Patent No.: US 9,899,336 B2
(45) Date of Patent: Feb. 20, 2018

(54) SEMICONDUCTOR DEVICE

(71) Applicant: Mitsubishi Electric Corporation, Tokyo (JP)

(72) Inventors: Takanobu Kajihara, Tokyo (JP); Daisuke Nakashima, Tokyo (JP); Katsuhiko Omae, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/104,750

(22) PCT Filed: Apr. 4, 2014

(86) PCT No.: PCT/JP2014/059974
§ 371 (c)(1),
(2) Date: Jun. 15, 2016

(87) PCT Pub. No.: WO2015/151273
PCT Pub. Date: Oct. 8, 2015

(65) Prior Publication Data
US 2016/0315054 A1    Oct. 27, 2016

(51) Int. Cl.
*H01L 21/56* (2006.01)
*H01L 23/495* (2006.01)
(Continued)

(52) U.S. Cl.
CPC .......... *H01L 23/562* (2013.01); *H01L 21/565* (2013.01); *H01L 23/3114* (2013.01);
(Continued)

(58) Field of Classification Search
CPC ...... H01L 33/62; H01L 23/28; H01L 23/3142
(Continued)

(56) References Cited

U.S. PATENT DOCUMENTS

2004/0108602 A1    6/2004 Nakajima et al.
2008/0216921 A1*   9/2008 Kwan ................... C22C 1/00
                                                148/95
(Continued)

FOREIGN PATENT DOCUMENTS

JP    2006-032775 A    2/2006
JP       3748849 B2    2/2006
(Continued)

OTHER PUBLICATIONS

International Search Report of PCT/JP2014/059974 dated Jul. 8, 2014.
Communication dated Jan. 24, 2017 from the Japanese Patent Office in counterpart Application No. 2016-511284.
Extended European Search Report, dated Dec. 13, 2017, issued in European Patent Application No. 14 887 816.8.

*Primary Examiner* — Moazzam Hossain
*Assistant Examiner* — Omar Mojaddedi
(74) *Attorney, Agent, or Firm* — Sughrue Mion, PLLC; Richard C. Turner

(57) ABSTRACT

A scale-like portion wherein metal plating is changed into a scale-like form is provided by continuously carrying out laser spot irradiation on a lead frame, the front surface of which is coated with the metal plating. The scale-like portion is disposed in an optional portion of the lead frame, for example, in the vicinity of a gate break mark, in an outer peripheral portion in a region sealed with a molding resin, or around a semiconductor element. The adhesion between the lead frame and the molding resin improves owing to the anchor effect of the scale-like portion, and it is thus possible to suppress the molding resin separating from the lead frame.

10 Claims, 7 Drawing Sheets

(51) Int. Cl.
  *H01L 23/31* (2006.01)
  *H01L 23/00* (2006.01)
  *H01L 23/433* (2006.01)
(52) U.S. Cl.
  CPC ...... *H01L 23/3142* (2013.01); *H01L 23/4334* (2013.01); *H01L 23/4952* (2013.01); *H01L 23/49513* (2013.01); *H01L 23/49524* (2013.01); *H01L 23/49548* (2013.01); *H01L 23/49582* (2013.01); *H01L 24/36* (2013.01); *H01L 24/40* (2013.01); *H01L 23/3107* (2013.01); *H01L 2224/40095* (2013.01); *H01L 2224/40245* (2013.01); *H01L 2224/48091* (2013.01); *H01L 2224/48247* (2013.01); *H01L 2224/73221* (2013.01); *H01L 2224/73265* (2013.01); *H01L 2924/13055* (2013.01); *H01L 2924/13091* (2013.01); *H01L 2924/181* (2013.01); *H01L 2924/18301* (2013.01)
(58) Field of Classification Search
  USPC .................................................. 257/669, 676
  See application file for complete search history.

(56) References Cited

U.S. PATENT DOCUMENTS

| | | | |
|---|---|---|---|
| 2009/0152696 A1* | 6/2009 | Dimasacat | H01L 23/49503 257/676 |
| 2010/0320579 A1 | 12/2010 | Abbott | |
| 2013/0192388 A1* | 8/2013 | Kono | G01F 1/6845 73/861.47 |
| 2013/0228907 A1* | 9/2013 | Nakajo | H01L 24/49 257/676 |
| 2014/0117403 A1* | 5/2014 | Hayashi | H01L 33/62 257/99 |

FOREIGN PATENT DOCUMENTS

| | | |
|---|---|---|
| JP | 2010-161098 A | 7/2010 |
| JP | 2013-153032 A | 8/2013 |
| JP | 5264939 B2 | 8/2013 |

* cited by examiner

A-A

B-B

SEMICONDUCTOR DEVICE

CROSS REFERENCE TO RELATED APPLICATIONS

This application is a National Stage of International Application No. PCT/JP2014/059974 filed Apr. 4, 2014, the contents of which are incorporated herein by reference in its entirety.

TECHNICAL FIELD

The present invention relates to a resin molded semiconductor device, and particularly to an improvement in the adhesion between a lead frame and a molding resin.

BACKGROUND ART

In a semiconductor device, a copper plate or a copper alloy plate is used for a lead frame on which to mount a semiconductor element, and the front surface of the lead frame is coated with metal plating, such as gold, silver, nickel, or tin, for the purpose of an improvement in corrosion resistance and heat resistance. Above all, nickel plating is often employed.

Meanwhile, by coating the front surface of the lead frame with metal plating, the adhesion to a molding resin such as an epoxy resin used in transfer molding decreases in some cases. Because of this, it may happen that initial separation occurs between the lead frame and the molding resin immediately after the transfer molding. Also, it is known that the molding resin becomes likely to separate from the lead frame due to the repeated heat stress in the environment of usage.

As a preceding example which has a configuration for improving the adhesion between the metal plating on the front surface of the lead frame and the molding resin, in PTL 1, a package component including a covering surface, which is sealed with an insulating resin, in at least one portion of the front surface is configured so as to have a rough-surfaced plating layer wherein the front surface of the lead frame is covered with a conductive film, and furthermore, wherein the conductive film on the covering surface is roughened (refer to FIG. 13).

Also, in PTL 2, a configuration is such that a plurality of quadrate depressions are disposed in length and breadth at substantially regular intervals by so-called dimpling whereby the lead frame is pressed with a die, thus suppressing separation of the molding resin owing to the anchor effect (refer to FIG. 14).

CITATION LIST

Patent Literature

PTL 1: Japanese Patent No. 5,264,939
PTL 2: Japanese Patent No. 3,748,849

SUMMARY OF INVENTION

Technical Problem

However, the rough-surfaced plating layer of the package component shown in PTL 1 has the problem of being inferior in wire bondability to a smooth surface plating layer. Because of this, there is an increasing likelihood of a decrease in wire bonding strength or of non-bonding. Also, there is also a method of coating a wire connection portion partially with stripe plating or mask plating, but the method has the problem of being costly compared with overall plating.

Also, the quadrate depressions of the semiconductor device shown in PTL 2 need a width of on the order of 200 µm when taking into account the workability of dimpling, and the dimpling is difficult when a sufficient area cannot be secured on the lead frame. In particular, there is the problem that the vicinity of the wire connection portion of the lead frame is often a region having a narrow area, and is difficult to dimple. Also, when intending to secure the area in which to form the quadrate depressions, it prevents a miniaturization of the semiconductor device.

Also, when a nickel plating layer is formed on the front surface of the lead frame, there is the problem that as nickel plating is high in hardness compared with copper, the projections of the die for forming the quadrate depressions wear down quickly, thus reducing productivity.

Furthermore, there is the problem that the lead frame is distorted due to the dimpling, and it is thus not possible to secure the flatness of the lead frame. In particular, in the case of a semiconductor device wherein an electronic component is bridge mounted, stress is generated due to the distortion of the lead frame, thus doing damage to a solder and the electronic component, meaning that it is essential to secure the flatness of the lead frame.

The invention, bearing in mind the heretofore described problems, has for its object to provide a semiconductor device which is improved in the adhesion between the lead frame, the front surface of which is coated with metal plating, and the molding resin, and which can be miniaturized and is high in productivity and reliability.

Solution to Problem

A semiconductor device according to the invention includes a lead frame on which to mount a semiconductor element; and a molding resin which seals at least a surface of the lead frame on which the semiconductor element is mounted, wherein the lead frame, the front surface of which is partially or totally coated with metal plating, has in a region sealed with the molding resin a scale-like portion wherein the surface form of the metal plating is changed to a scale-like form.

Advantageous Effects of Invention

According to the semiconductor device of the invention, the adhesion between the lead frame and the molding resin improves owing to the anchor effect of the scale-like portion, and it is thus possible to suppress the molding resin separating from the lead frame. As the scale-like portion is formed by changing the surface form of the metal plating, it is possible to easily dispose the scale-like portion in an optional portion, and the flatness of the lead frame is not impaired when processing, meaning that it is possible to obtain semiconductor device which can be miniaturized and is high in productivity and reliability.

Objects, features, perspectives, and advantageous effects of the invention other than those above will be further clarified from the following detailed description of the invention referring to the drawings.

DESCRIPTION OF EMBODIMENTS

Embodiment 1

Figure 1:
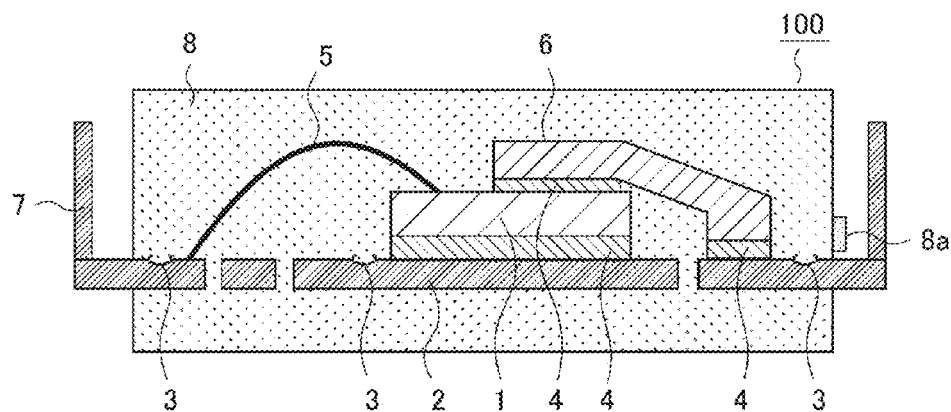
FIG. 1 is a sectional view showing a semiconductor device according to Embodiment 1 of the invention.

Hereafter, a description will be given, based on the drawings, of a semiconductor device according to Embodiment 1 of the invention. FIG. 1 shows an example of the structure of a resin molded semiconductor device according to Embodiment 1. A semiconductor device 100 according to Embodiment 1 is configured including a semiconductor element 1, a lead frame 2, a wire 5, an inner lead 6, an external terminal 7, and the like. In all the following drawings, identical and equivalent portions are given the same reference signs.

The semiconductor element 1 is, for example, an IGBT, a MOSFET, an IC chip, or an LSI chip, and is mounted on the top of the lead frame 2 via a joining member 4, such as solder or silver. The lead frame 2, on which to mount the semiconductor element 1 or other electronic components, is made of a copper plate or a copper alloy plate, and the front surface of the lead frame 2 is coated with metal plating (not shown), such as gold, silver, nickel, or tin. Also, the lead frame 2 has scale-like portions 3 wherein the surface form of the metal plating is changed to a scale-like form. A detailed description will hereafter be given of the scale-like portions 3.

An electrode pad of the semiconductor element 1 is connected to the external terminal 7 via the wire 5 connected by wire bonding or via the inner lead 6 made of a material, such as a copper plate or a copper alloy plate. The wire 5 and the inner lead 6 are transposable with each other. The wire 5 is made of gold, silver, aluminum, copper, or the like, and the diameter of the wire 5 is on the order of 20 μm to 500 μm.

At least a surface of the lead frame 2, on which the semiconductor element 1 is mounted, is sealed with a molding resin 8, such as an epoxy resign, by transfer molding. In the example of FIG. 1, both surfaces of the lead frame 2 are sealed with the molding resin 8. A gate break mark 8a exists in a predetermined portion of the molding resin 8.

Figure 2:
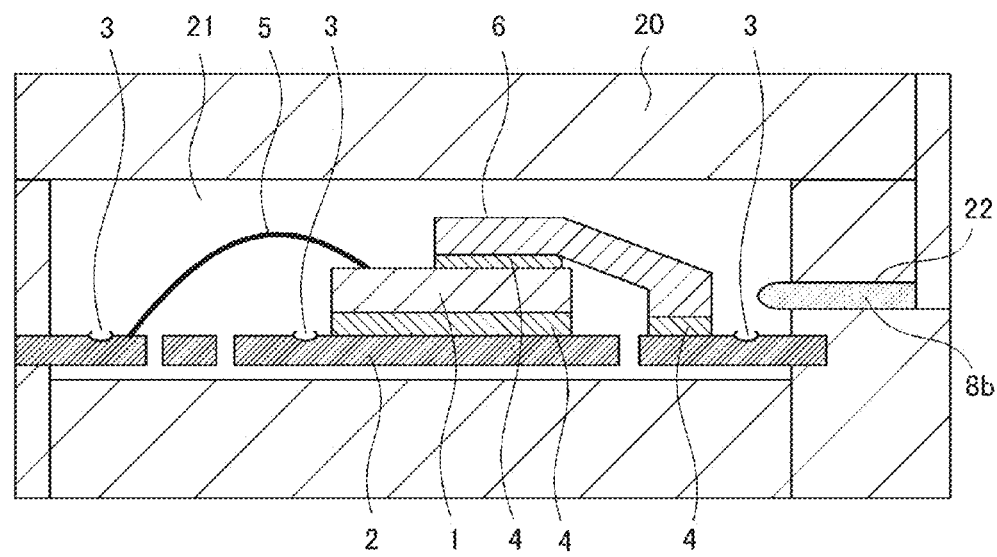
FIG. 2 is a sectional view showing a transfer molding step of the semiconductor device according to Embodiment 1 of the invention.

FIG. 2 shows a transfer molding step in the process of manufacturing the semiconductor device 100. As shown in FIG. 2, the lead frame 2, on which the semiconductor element 1 and other members are mounted, is installed inside a molding tool 20. A molten molding resin is injected into a cavity 21 of the molding tool 20.

A molding resin remaining in a gate 22 which is the path of the molding resin in the molding tool 20 is called a runner 8b. After the transfer molding, gate break to separate the runner 8b and semiconductor device 100 is implemented immediately after the semiconductor device 100 is removed from the molding tool 20. The gate break mark 8a remains in the semiconductor device 100 after the gate break.

In the transfer molding step, when releasing the semiconductor device 100 from the molding tool 20, it may happen that stress to separate the molding resin 8 from the lead frame 2 acts to cause initial separation. The stress is due, for example, to that a slight mold resin 8 adheres to the molding tool 20, or that the clearance between the external terminal 7 and the molding tool 20 is made very narrow so as to prevent a large amount of molding resin 8 leaking from the molding tool 20.

Also, initial separation is also likely to occur in the vicinity of the gate break mark 8a of the semiconductor device 100. This is due to that a force is applied to the lead frame 2 when implementing the gate break, or that the vicinity of the gate break mark 8a, being a portion through which a molding resin 8 increased in viscosity flows, is inferior in the adhesion to the lead frame 2.

Also, initial separation is likely to occur in a portion of the semiconductor device 100 which is at the longest linear distance from the gate break mark 8a, that is, in the vicinity of a portion which is finally filled with the molding resin. This is due to that as the thermosetting molding resin 8 flows finally into the portion which is at the longest distance from the gate break mark 8a in a condition in which the molding resin 8 is increased in viscosity and reduced in wettability, the molding resin 8 is inferior in the adhesion to the lead frame 2.

Furthermore, even when there is no initial separation, it may happen that separation occurs between the lead frame 2 and the molding resin 8 due to the repeated heat stress in the environment of usage. In particular, when a solder is used as the joining member 4, the adhesion of the solder to the molding resin 8 is lower than to the other portions, meaning that the molding resin 8 is likely to separate from a portion of the lead frame 2 to which the solder adheres.

As means which suppresses this kind of separation of the molding resin 8 from the lead frame 2, the semiconductor device 100 has the scale-like portions 3 wherein the surface condition of the metal plating coating the front surface of the lead frame 2 is changed into a scale-like form. The anchor effect of the scale-like portions 3 increases the adhesion between the metal plating and the molding resin 8, thus suppressing the molding resin 8 separating from the lead frame 2.

Figure 3:
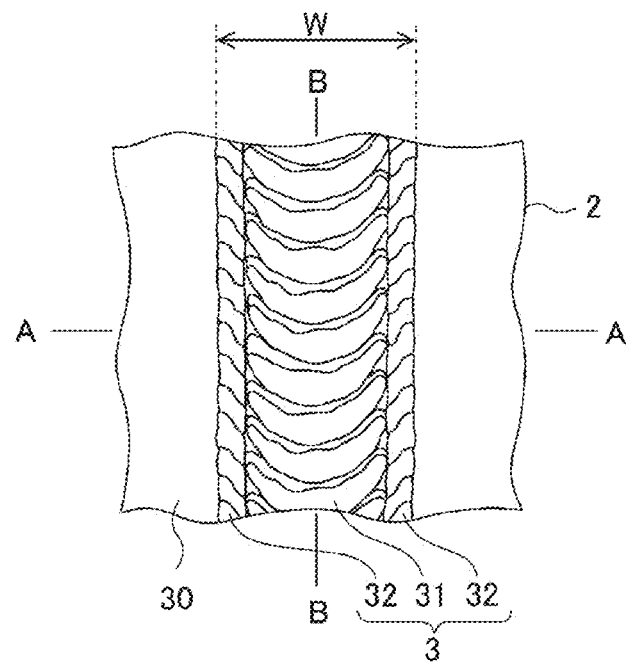
FIG. 3 is a top view showing a scale-like portion in the semiconductor device according to Embodiment 1 of the invention.
Figure 4:
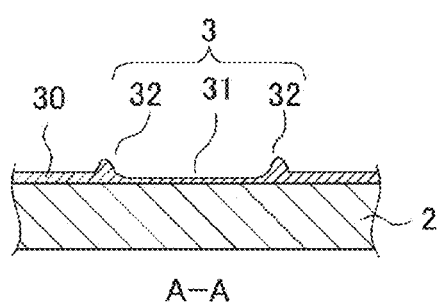
FIG. 4 is a sectional view showing the scale-like portion in the semiconductor device according to Embodiment 1 of the invention.
Figure 5:
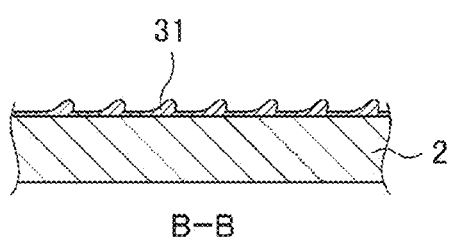
FIG. 5 is a sectional view showing the scale-like portion in the semiconductor device according to Embodiment 1 of the invention.
Figure 6:
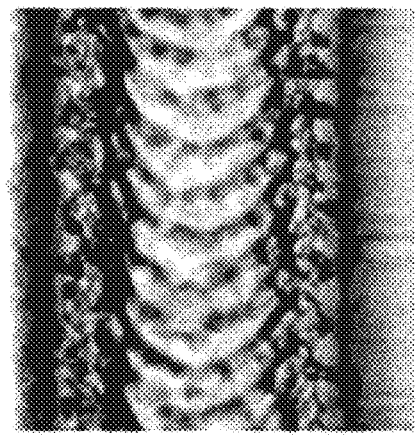
FIG. 6 is a scanning electron micrograph showing the form of the scale-like portion in the semiconductor device according to Embodiment 1 of the invention.
Figure 7:
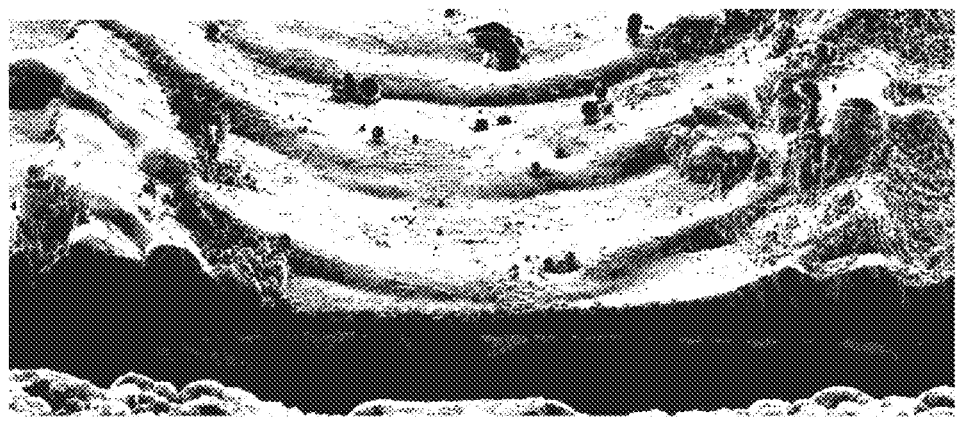
FIG. 7 is a scanning electron micrograph showing the form of the scale-like portion in the semiconductor device according to Embodiment 1 of the invention.

FIG. 3 is a top view showing the scale-like portion 3 in the semiconductor device 100, FIG. 4 is a sectional view sectioned by the A-A portion shown in FIG. 3, and FIG. 5 is a sectional view sectioned by the B-B portion shown in FIG. 3. Also, FIGS. 6 and 7 are scanning electron micrographs showing the form of the scale-like portion 3.

The scale-like portion 3 is such that a metal plating layer 30 is changed into a scale-like form by continuously carrying out laser spot irradiation on the lead frame 2, and as shown in FIG. 3, is disposed on an optional straight line or curved line so as to have a predetermined width W.

The scale-like portion 3 has a scale portion 31, in which scale-like projections are continuously disposed, and ridges 32 raised higher than the scale portion 31, one on either side of the scale portion 31. The width W and height of the scale-like portion 3 can be adjusted by a laser output, scan speed, or the like.

The width W of the scale-like portion 3 is on the order of, for example, 60 μm, but may be increased in accordance with the area of a portion in which the scale-like portion 3 is disposed. The adhesion to the molding resin 8 improves further by increasing the width W of the scale-like portion 3.

Figure 8:
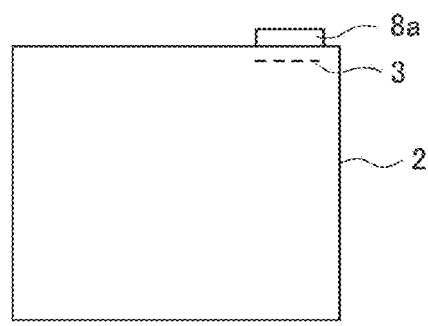
FIG. 8 is a diagram showing an example of disposition of the scale-like portion in the semiconductor device according to Embodiment 1 of the invention.

A description will be given, using FIGS. 8 to 12, of examples of disposition of the scale-like portion 3 and the advantageous effects thereof. In the example of FIG. 8, the scale-like portion 3 is disposed in the vicinity of the gate break mark 8a of the lead frame 2, that is, in a portion adjacent to the gate 22 (refer to FIG. 2) of the molding tool 20. By so doing, it is possible to improve the adhesion between the metal plating layer 30 and the molding resin 8 in the vicinity of the gate break mark 8a in which initial separation is likely to occur.

Figure 9:
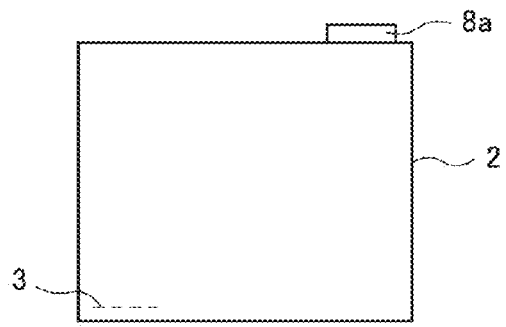
FIG. 9 is a diagram showing an example of disposition of the scale-like portion in the semiconductor device according to Embodiment 1 of the invention.

Also, in the example of FIG. 9, the scale-like portion 3 is disposed in the vicinity of a portion of the lead frame 2 which is at the longest linear distance from the gate break mark 8a. By so doing, it is possible to improve the adhesion between the metal plating layer 30 and the molding resin 8 in the vicinity of the portion, which is finally filled with the molding resin 8, in which initial separation is likely to occur.

Figure 10:
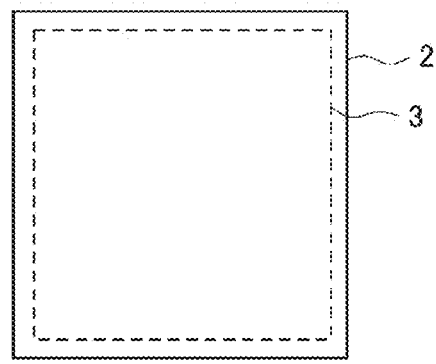
FIG. 10 is a diagram showing an example of disposition of the scale-like portion in the semiconductor device according to Embodiment 1 of the invention.

Also, in the example of FIG. 10, the scale-like portion 3 is disposed in an outer peripheral portion of the lead frame 2 in the region sealed with the molding resin 8. By so doing, it is possible to suppress the initial separation caused by the stress when releasing the semiconductor device 100 from the molding tool 20 and the separation caused by the stress from the other externals, thus producing the advantageous effect of preventing the intrusion of water or contamination into the molding resin 8.

Figure 11:
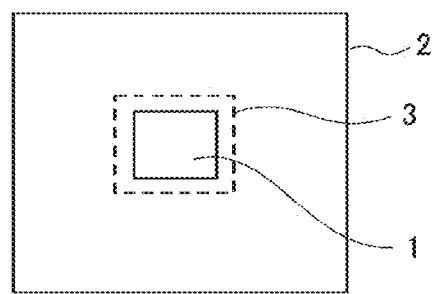
FIG. 11 is a diagram showing an example of disposition of the scale-like portion in the semiconductor device according to Embodiment 1 of the invention.

Also, in the example of FIG. 11, the scale-like portion 3 is disposed around a portion of the lead frame 2 on which the semiconductor element 1 is mounted. By so doing, it is possible to suppress the separation, caused by the repeated heat stress in the environment of usage, which is likely to occur in the vicinity of the joining member 4, thus achieving an increase in the life of the semiconductor device 100. Furthermore, when the joining member 4 is a solder, the wetting angle of the solder increases by disposing the scale-like portion 3 so as to surround the vicinity of the joining member 4, and it is thus possible to prevent the solder from flowing out.

Figure 12:
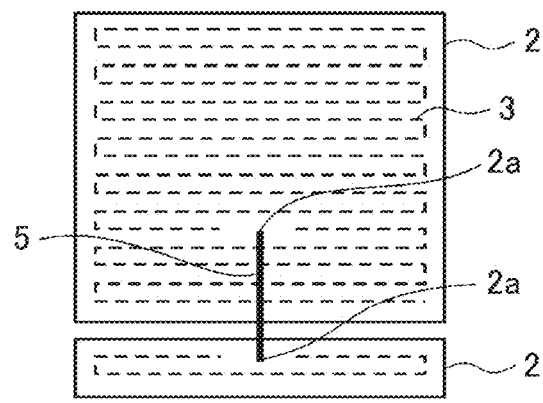
FIG. 12 is a diagram showing an example of disposition of the scale-like portions in the semiconductor device according to Embodiment 1 of the invention.

Furthermore, in the example of FIG. 12, the scale-like portions 3 are disposed widely in a region other than a wire connection portion 2a of the lead frame 2. By disposing the scale-like portions 3 avoiding the wire connection portion 2a of the lead frame 2 in this way, wire bondability is prevented from deteriorating, and it is thus possible to successfully loin the wire 5 and lead frame 2.

As the scale-like portion 3 is formed by laser spot irradiation in this way, it is possible to form the scale-like portion 3 in an optional portion on the lead frame 2. It is also easy to selectively treat only a portion in which to intend to dispose the scale-like portion 3, and carry out treatment avoiding a portion, for example, the wire connection portion 2a in which not to dispose the scale-like portion 3. Also, by unicursally drawing the pattern of treating the scale-like portion 3, as shown in FIGS. 8 to 12, a tact time can be shortened, and productivity improves.

Figure 13:
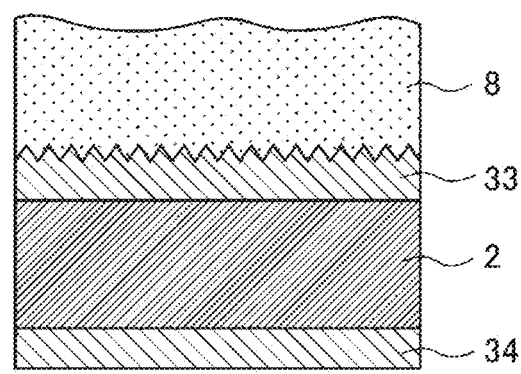
FIG. 13 is a diagram showing a configuration for an improvement in the adhesion between a lead frame and molding resin in a heretofore known semiconductor device.
Figure 14:
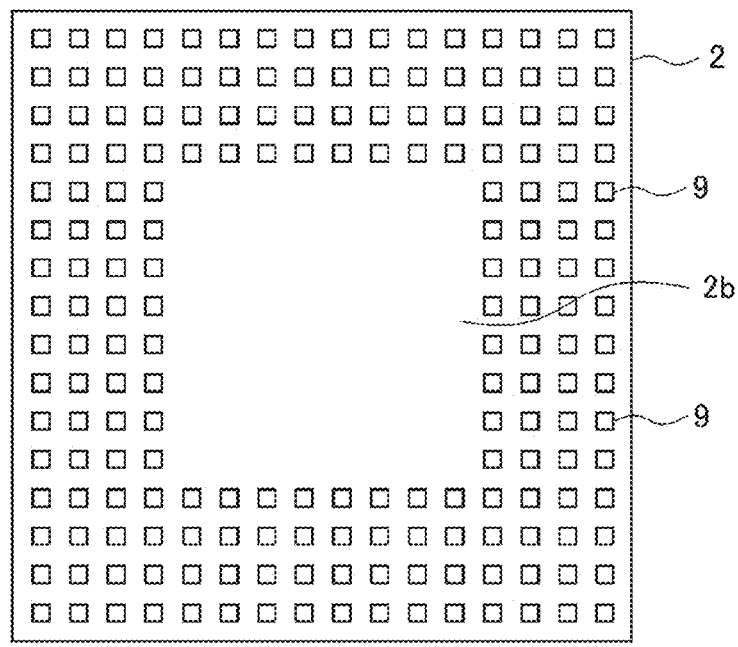
FIG. 14 is a diagram showing a configuration for an improvement in the adhesion between a lead frame and molding resin in another heretofore known semiconductor device.

Next, as comparison examples of the semiconductor device 100 according to Embodiment 1, FIGS. 13 and 14 each show a configuration for improving the adhesion between the lead frame and the molding resin in a heretofore known semiconductor device. In a heretofore known example shown in FIG. 13, a rough-surfaced plating layer 33, which has a surface profile wherein the surface covered with a nickel plating layer is roughened, is formed to a predetermined film thickness on the molding resin 8 side surface of the lead frame 2.

A package component in which is formed this kind of rough-surfaced plating layer 33 is such that the adhesion between the lead frame 2 and the molding resin 8 improves, and moreover, that the adhesion does not deteriorate. However, the rough-surfaced plating layer 33 has the problem that as it is inferior in wire bondability to a smooth surface plating layer 34, there is an increasing likelihood of a decrease in wire bonding strength or of non-bonding.

In response to this, as the scale-like portion 3 in the semiconductor device 100 according to Embodiment 1 is advantageous in that the scale-like portion 3 can be selectively formed in an optional portion on the lead frame 2, and can be treated avoiding the wire connection portion 2a of the lead frame 2, thus causing no reduction in wiring bondability.

Also, in another heretofore known example shown in FIG. 14, a plurality of quadrate depressions 9 are formed in length and breadth at substantially regular intervals, in a region other than a die pad 2b of the lead frame 2, by dimpling with a lead frame press die. Even in a semiconductor device having this kind of configuration, the adhesion between the lead frame 2 and the molding resin improves owing to the anchor effect of the quadrate depressions 9.

However, as the quadrate depressions 9 require a width of on the order of 200 μm when taking into account the workability of dimpling, and no sufficient area can be secured depending on the design of the lead frame 2, it is difficult to dimple the lead frame 2. In response to this, the scale-like portion 3 in Embodiment 1 can also be formed in a narrow space of on the order of 60 μm, and it is thus possible to contribute to a miniaturization of the semiconductor device. Also, the scale-like portion 3 is advantageous in that as the scale-like portion 3 is laser processed, there is no need for the die, and it is not necessary to take into account the wearing down or the like of the projections of the die, thus leading to an increase in productivity.

Also, when the semiconductor device 100 is examined with an ultrasound imager or the like, it may be revealed that separation is likely to occur in an unexpected portion. In this case, a considerable work period and cost is required to modify or newly build the molding tool 20 (refer to FIG. 2). The scale-like portion 3 in Embodiment 1 is also effective against this kind of situation. That is, the scale-like portion 3 can be selectively disposed in a portion in which it is revealed that separation is likely to occur, and it is thus possible to respond thereto at low cost.

Furthermore, the quadrate depressions 9 are such that as there is a space between adjacent quadrate depressions 9, a solder with which to bond the semiconductor element may flow out to the periphery from the space. In response to this, in Embodiment 1, by disposing the scale-like portion 3 so as to surround the semiconductor element 1, as shown in FIG. 11, the ridges 32 of the scale-like portion 3 serve as stoppers, thus producing a great advantageous effect in preventing the solder from flowing out. Because of this, it is possible to suppress a misalignment of the semiconductor element 1.

In Embodiment 1, a description has been given of the semiconductor device 100 manufactured using a transfer molding method, but the method of manufacturing the semiconductor device 100 is not limited to this. For example, the semiconductor device 100 may be manufactured using an injection molding method, and in this case, as the cost of a resin is low, it is possible to contribute to a reduction in cost.

As above, the semiconductor device 100 according to Embodiment 1 is such that as the adhesion between the lead frame 2 and the molding resin 8 improves owing to the anchor effect of the scale-like portion 3, it is possible to suppress the molding resin 8 separating from the lead frame 2.

Also, as the scale-like portion 3 is formed by laser irradiating the lead frame 2, the scale-like portion 3 can be easily disposed in an optional portion, and the flatness of the lead frame 2 is not impaired when processing. For these reasons, according to Embodiment 1, it is possible to obtain the semiconductor device 100 which can be miniaturized and is high in productivity and reliability.

Embodiment 2

Figure 15:
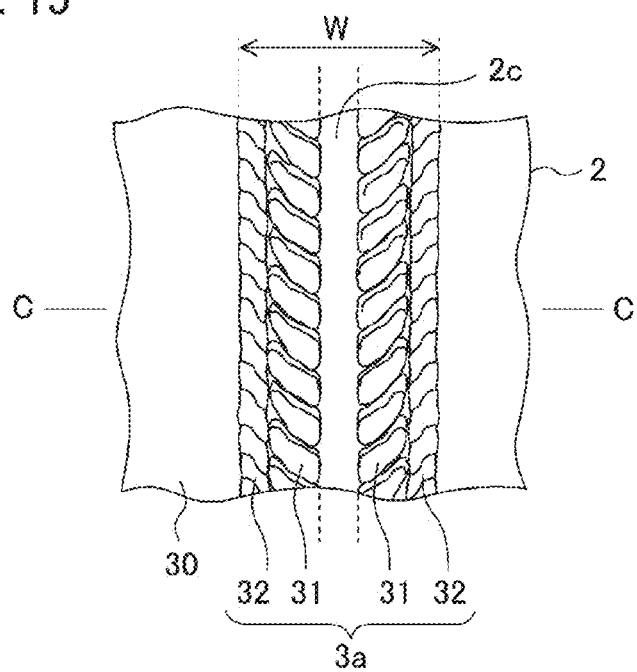
FIG. 15 is a top view showing a scale-like portion in a semiconductor device according to Embodiment 2 of the invention.
Figure 16:
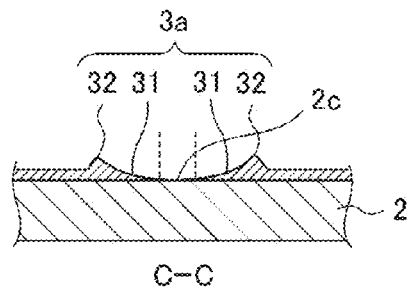
FIG. 16 is a sectional view showing the scale-like portion in the semiconductor device according to Embodiment 2 of the invention.

As the overall configuration of a semiconductor device according to Embodiment 2 of the invention is the same as in Embodiment 1, the description of each portion will be omitted with FIG. 1 applied thereto. FIG. 15 is a top view showing a scale-like portion 3a in the semiconductor device 100 according to Embodiment 2, and FIG. 16 is a sectional view sectioned by the C-C portion shown in FIG. 15.

The scale-like portion 3a in Embodiment 2 has an exposed portion 2c which exposes the lead frame 2 underneath the metal plating layer 30, that is, copper or a copper alloy, in the vicinity of the central portion of the predetermined width W. The other configurations are the same as those of the scale-like portion 3 in Embodiment 1. As the exposed copper or copper alloy has a high adhesion to the molding resin 8 compared with the metal plating layer 30, it is possible to more suppress the separation of the molding resin than in Embodiment 1.

As the method of exposing the lead frame 2 in the central portion of the scale-like portion 3a, there are a method of fully melting the metal plating of the central portion by increasing the output of laser irradiation compared with in Embodiment 1, a method of scraping away the metal plating using physical processing, such as shot blasting, after the laser treatment, and the like.

Copper which is the material of the lead frame 2 is easy to oxidize, and it is costly to control the degree of oxidation in a condition in which the copper is exposed, but in Embodiment 2, by forming the scale-like portion 3a in the step immediately before transfer molding and making the period of time for which to expose the copper as short as possible, it is easy to control the copper oxidation degree, and it is possible to suppress an increase in the cost to control the copper oxidation degree.

According to Embodiment 2, in addition to the same advantageous effects s in Embodiment 1, the effect of suppressing the separation of the molding resin 8 from the lead frame 2 becomes higher than in Embodiment 1 by providing the exposed portion 2c, which exposes the copper or copper alloy with a high adhesion to the molding resin 8, in the central portion of the scale-like portion 3a.

Embodiment 3

Figure 17:
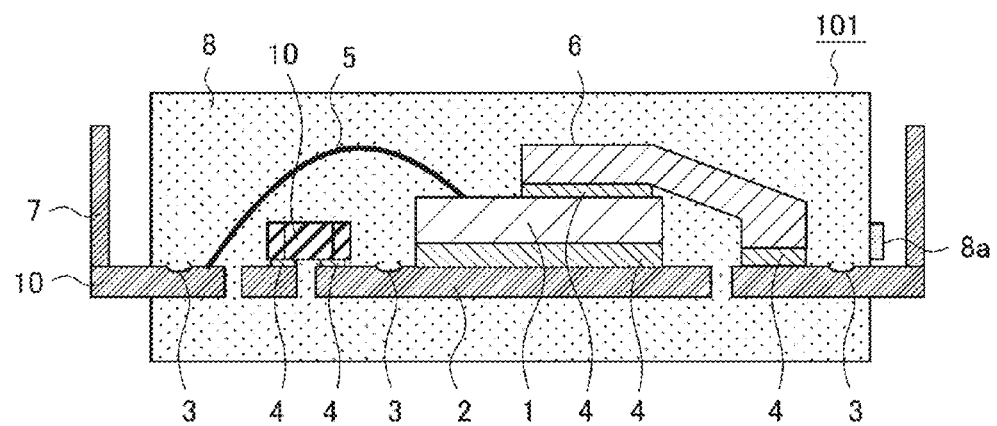
FIG. 17 is a sectional view showing a semiconductor device according to Embodiment 3 of the invention.

In Embodiment 3 of the invention, a description will be given of an example wherein the scale-like portion 3 is applied to a semiconductor device different in configuration from the semiconductor device 100 according to Embodiment 1. FIG. 17 shows a semiconductor device 101 according to Embodiment 3. The semiconductor device 101 includes an electronic component 10 which is bridge mounted so as to bridge between two separated regions of the lead frame 2. The electronic component 10 is a capacitor, a thermistor, or the like.

In Embodiment 3, the two regions of the lead frame 2, in which the electronic component 10 is bridge mounted, may be a region in which the semiconductor element 1 is not mounted and a region in which the semiconductor element 1 is mounted, two regions in which the semiconductor element 1 is mounted, or two regions in which the semiconductor element 1 is not mounted.

When there is a distortion in the lead frame 2 when bridge mounting the electronic component 10, stress is applied to the electronic component 10 and joining member 4, thus causing damage thereto. In the heretofore known example shown in FIG. 14, as the quadrate depressions 9 are formed by dimpling using a die, it is not possible to secure the flatness of the lead frame, and the bridge mounting is technically difficult.

In response to this, in the semiconductor device 101 according to Embodiment 3, the scale-like portion 3 is provided by laser spot irradiation, and the flatness of the lead frame 2 is not impaired when processing. Because of this, the difference in level between the regions of the lead frame 2 is several tens μm, and the flatness is secured. For this reason, the stress applied to the electronic component 10 which is bridge mounted and to the joining member 4 is relaxed, and it is thus possible to prevent the damage to the electronic component 10 and a crack in the joining member 4.

Also, when the electronic component 10 is a capacitor which functions as a noise filter, it is easy to dispose the electronic component 10 inside the semiconductor device 101 by bridge mounting the electronic component 10, thus increasing the effect of functioning as the noise filter. Furthermore, by disposing the scale-like portion 3 in a portion of the lead frame 2 around the electronic component 10, it is possible to suppress the separation, caused by the repeated heat stress in the environment of usage, which is likely to occur in the vicinity of the joining member 4.

Figure 18:
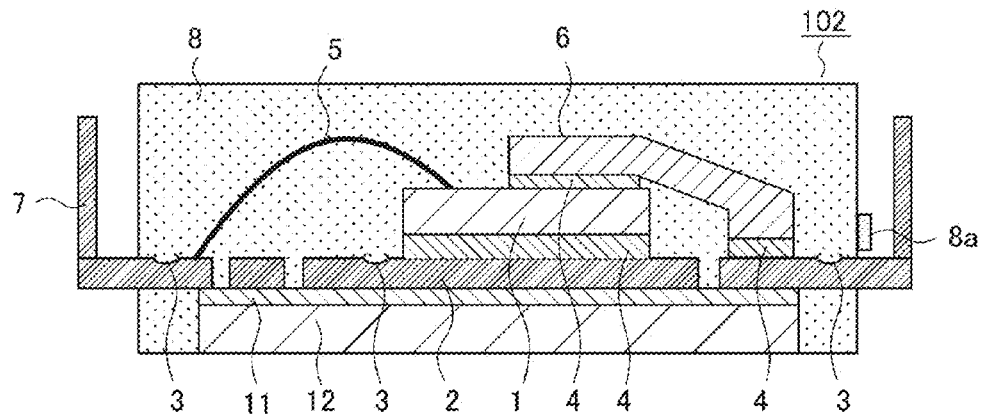
FIG. 18 is a sectional view showing another semiconductor device according to Embodiment 3 of the invention.

FIG. 18 shows another semiconductor device 102 according to Embodiment 3. The semiconductor device 102 has a sheet 12 attached to the bottom of the lead frame 2 via an adhesive member 11. The adhesive member 11 is grease, an adhesive agent, a resin-based adhesive material, or the like. Ceramics or silicone, which has electrical insulating properties and is high in thermal conductivity, is used for the sheet 12.

Also, when the adhesive member 11 has electrical insulating properties, copper which is high in thermal conductivity is used for the sheet 12. Furthermore, when mounting a heat sink, the sheet 12 may be attached to the heat sink side. In this way, it is possible to apply the scale-like portion 3 even when the bottom of the lead frame 2 is not covered with the molding resin 8, and it is possible to obtain the semiconductor device 102 which is superior in heat releasability.

In FIGS. 17 and 18, the scale-like portion 3 provided in the semiconductor device 101, 102, but the scale-like portion 3a, in the central portion of which the lead frame 2 is exposed, may be provided. Also, the scale-like portion 3, 3a can be disposed in an optional portion, for example, as in the disposition examples of FIGS. 8 to 12.

According to Embodiment 3, it is possible to produce the same advantageous effects as in Embodiments 1 and 2, that is, to enhance the adhesion between the metal plating layer 30 and the molding resin 8 and thus suppress the molding resin 8 separating from the lead frame 2, and furthermore, it is possible to obtain a highly functional and reliable semiconductor device which has a long life and can be miniaturized.

The configuration of, and the method of manufacturing, a semiconductor device to which the invention is applied are not limited to Embodiments 1 to 3. The invention is such that it is possible to freely combine the embodiments, and to appropriately modify or omit any of the embodiments, within the scope of the invention.

INDUSTRIAL APPLICABILITY

The invention is available for a resin molded semiconductor device.

The invention claimed is:

1. A semiconductor device, comprising:
    a lead frame on which a semiconductor element is mounted;
    a metal plating that partially or totally coats a front surface of the lead frame; and
    a molding resin which seals at least the front surface of the lead frame and the semiconductor element mounted on the lead frame, wherein
    the metal plating has a scale-like portion in a region sealed with the molding resin, and
    the scale-like portion includes a first ridge and a second ridge that are protruded from the metal plating and disposed at both ends of the scale-like portion in a first direction, and a plurality of projections that are protruded from the metal plating and continuously disposed in a second direction perpendicular to the first direction, and
    both the first direction and the second direction are horizontal to the front surface of the lead frame.

2. The semiconductor device according to claim 1, wherein
    the scale-like portion has an exposed portion at a center of the scale-like portion, and the lead frame underneath the metal plating is exposed to the molding resin through the exposed portion.

3. The semiconductor device according to claim 1, wherein
    a molding tool is used when the molding resin is sealed,
    the molding tool has a gate as a path of a molten molding resin injected into the molding tool, and
    the scale-like portion is disposed in a portion of the lead frame adjacent to the gate.

4. The semiconductor device according to claim 1, wherein
    a molding tool is used when the molding resin is sealed,
    the molding tool has a gate as a path of a molten molding resin injected into the molding tool, and
    the scale-like portion is disposed in the vicinity of a portion of the lead frame which is at the longest linear distance from the gate.

5. The semiconductor device according to claim 1, wherein
    the scale-like portion is disposed in an outer peripheral portion of the lead frame in the region sealed with the molding resin.

6. The semiconductor device according to claim 1, wherein
    the scale-like portion is disposed around a portion of the lead frame on which the semiconductor element is mounted.

7. The semiconductor device according to claim 1, comprising:
    a wire which electrically connects the semiconductor element to a predetermined portion of the lead frame, wherein
    the scale-like portion is disposed in a region other than the predetermined portion of the lead frame connected to the wire.

8. The semiconductor device according to claim 1, comprising:
    an electronic component which is bridge mounted so as to bridge between two separated regions of the lead frame, wherein
    the scale-like portion is disposed around a portion of the lead frame on which the electronic component is mounted.

9. The semiconductor device according to claim 1, wherein
    the metal plating is transformed into the scale-like portion by laser irradiating the lead frame.

10. The semiconductor device according to claim 1, wherein the scale-like portion is disposed on an optional straight line or curved line so as to have a predetermined width.

* * * * *